United States Patent
Peng

(10) Patent No.: US 11,251,130 B2
(45) Date of Patent: Feb. 15, 2022

(54) SEMICONDUCTOR STRUCTURE AND MANUFACTURE METHOD THEREOF

(71) Applicant: Silergy Semiconductor Technology (Hangzhou) LTD, Hangzhou (CN)

(72) Inventor: Chuan Peng, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/211,036

(22) Filed: Jul. 15, 2016

(65) Prior Publication Data
US 2017/0018430 A1 Jan. 19, 2017

(30) Foreign Application Priority Data

Jul. 16, 2015 (CN) .......................... 201510420281.0

(51) Int. Cl.
| H01L 21/02 | (2006.01) |
| H01L 23/535 | (2006.01) |
| H01L 29/786 | (2006.01) |
| H01L 21/28 | (2006.01) |

(52) U.S. Cl.
CPC ...... H01L 23/535 (2013.01); H01L 21/28052 (2013.01); H01L 29/786 (2013.01)

(58) Field of Classification Search
CPC ............. H01L 21/266; H01L 21/28008; H01L 23/535; H01L 29/786; H01L 21/82345; H01L 21/823462; H01L 21/823857; H01L 29/66477
See application file for complete search history.

(56) References Cited

U.S. PATENT DOCUMENTS

| 4,833,096 A * | 5/1989 | Huang | H01L 21/76802 438/201 |
| 5,254,489 A * | 10/1993 | Nakata | H01L 21/32 148/DIG. 112 |
| 5,532,181 A * | 7/1996 | Takebuchi | H01L 27/105 257/E21.422 |
| 5,576,226 A * | 11/1996 | Hwang | H01L 21/823462 438/275 |
| 5,658,812 A * | 8/1997 | Araki | H01L 27/11546 438/258 |
| 5,668,035 A * | 9/1997 | Fang | H01L 27/105 257/E27.081 |
| 5,723,355 A * | 3/1998 | Chang | H01L 27/11546 438/275 |
| 5,729,037 A | 3/1998 | Hshieh et al. | |
| 5,856,221 A * | 1/1999 | Clementi | H01L 27/105 257/E21.689 |
| 5,888,869 A * | 3/1999 | Cho | H01L 27/115 438/258 |

(Continued)

FOREIGN PATENT DOCUMENTS

CN 103367255 A 10/2013

*Primary Examiner* — Jay C Kim

(57) ABSTRACT

A method of making a semiconductor structure can include: (i) forming a plurality of oxide layers on a semiconductor substrate; (ii) forming a plurality of conductor layers on the plurality of oxide layers; (iii) forming plurality of thickening layers on the plurality of conductor layers; (iv) patterning the plurality of conductor layers and the plurality of thickening layers to form a hard mask; and (v) implanting ion using the hard mask to form a plurality of doped regions.

9 Claims, 6 Drawing Sheets

(56) References Cited

U.S. PATENT DOCUMENTS

| | | | | |
|---|---|---|---|---|
| 5,908,311 A | * | 6/1999 | Chi | H01L 27/105 257/E21.689 |
| 5,970,345 A | * | 10/1999 | Hattangady | H01L 21/823462 257/E21.625 |
| 5,972,751 A | * | 10/1999 | Ramsbey | H01L 21/28202 438/257 |
| 6,037,222 A | * | 3/2000 | Huang | H01L 27/10894 257/E21.645 |
| 6,054,350 A | * | 4/2000 | Hsieh | H01L 27/115 257/E21.422 |
| 6,069,037 A | * | 5/2000 | Liao | H01L 21/823443 257/E21.622 |
| 6,087,225 A | | 7/2000 | Bronner et al. | |
| 6,087,236 A | * | 7/2000 | Chau | H01L 21/823462 257/E21.625 |
| 6,107,134 A | * | 8/2000 | Lu | H01L 27/105 257/E21.645 |
| 6,117,730 A | * | 9/2000 | Komori | H01L 27/11526 257/E21.679 |
| 6,133,096 A | * | 10/2000 | Su | H01L 27/105 257/E21.684 |
| 6,146,795 A | * | 11/2000 | Huang | G03F 7/36 430/30 |
| 6,146,948 A | * | 11/2000 | Wu | H01L 21/823462 257/E21.625 |
| 6,147,008 A | * | 11/2000 | Chwa | H01L 21/823462 257/E21.625 |
| 6,200,834 B1 | * | 3/2001 | Bronner | H01L 21/823443 257/E21.622 |
| 6,268,251 B1 | * | 7/2001 | Zhong | H01L 21/823462 257/E21.625 |
| 6,271,092 B1 | * | 8/2001 | Lee | H01L 21/823456 257/E21.624 |
| 6,340,611 B1 | * | 1/2002 | Shimizu | H01L 27/115 257/E21.69 |
| 6,362,049 B1 | * | 3/2002 | Cagnina | H01L 27/11526 257/315 |
| 6,373,093 B2 | * | 4/2002 | Fujii | H01L 29/40114 257/314 |
| 6,388,293 B1 | * | 5/2002 | Ogura | G11C 16/0466 257/324 |
| 6,403,425 B1 | * | 6/2002 | Ang | H01L 21/823857 257/E21.639 |
| 6,410,387 B1 | * | 6/2002 | Cappelletti | H01L 27/105 257/E21.689 |
| 6,465,306 B1 | * | 10/2002 | Ramsbey | H01L 27/105 257/E21.679 |
| 6,472,259 B1 | * | 10/2002 | Naito | H01L 27/11526 438/201 |
| 6,489,650 B2 | * | 12/2002 | Kumazaki | H01L 27/11502 257/316 |
| 6,498,106 B1 | * | 12/2002 | Hsin | G03F 7/40 252/79.1 |
| 6,509,604 B1 | * | 1/2003 | Pham | H01L 21/76202 257/316 |
| 6,541,816 B2 | * | 4/2003 | Ramsbey | H01L 27/105 257/324 |
| 6,551,948 B2 | * | 4/2003 | Ohmi | C23C 8/02 257/E21.241 |
| 6,620,679 B1 | * | 9/2003 | Tzeng | H01L 27/10873 257/E21.654 |
| 6,653,192 B1 | * | 11/2003 | Ryoo | H01L 21/823462 257/E21.625 |
| 6,670,248 B1 | * | 12/2003 | Ang | H01L 21/28194 257/E21.625 |
| 6,696,735 B2 | * | 2/2004 | Fukui | H01L 21/28185 257/351 |
| 6,746,906 B2 | * | 6/2004 | Rabkin | H01L 21/823418 257/E21.619 |
| 6,787,421 B2 | * | 9/2004 | Gilmer | H01L 21/823462 438/275 |
| 6,815,764 B2 | * | 11/2004 | Bae | H01L 29/792 257/324 |
| 6,825,083 B1 | * | 11/2004 | Yang | H01L 27/105 257/E21.689 |
| 6,828,184 B2 | * | 12/2004 | Cho | H01L 21/823462 257/E21.228 |
| 6,855,641 B2 | * | 2/2005 | Ryu | H01L 27/092 257/E21.637 |
| 7,020,007 B2 | * | 3/2006 | Kwon | G11C 14/00 365/154 |
| 7,087,489 B2 | * | 8/2006 | Lee | H01L 27/105 257/314 |
| 7,098,147 B2 | * | 8/2006 | Nansei | H01L 21/3145 438/769 |
| 7,160,771 B2 | * | 1/2007 | Chou | H01L 21/823462 257/E21.625 |
| 7,179,709 B2 | * | 2/2007 | Kim | H01L 27/105 257/E21.177 |
| 7,183,153 B2 | * | 2/2007 | Lutze | H01L 27/115 438/201 |
| 7,202,125 B2 | * | 4/2007 | Pham | H01L 27/105 257/E21.689 |
| 7,250,654 B2 | * | 7/2007 | Chen | H01L 27/105 257/324 |
| 7,259,419 B2 | * | 8/2007 | Koo | H01L 27/105 257/314 |
| 7,288,452 B2 | * | 10/2007 | Lee | H01L 27/115 257/E21.058 |
| 7,297,597 B2 | * | 11/2007 | Dong | H01L 27/105 438/261 |
| 7,312,129 B2 | * | 12/2007 | Goktepeli | H01L 21/28132 257/E21.421 |
| 7,320,920 B2 | * | 1/2008 | Kim | H01L 29/66833 438/287 |
| 7,323,420 B2 | * | 1/2008 | Kim | H01L 21/28194 438/723 |
| 7,323,748 B2 | * | 1/2008 | Yamada | H01L 29/7841 257/347 |
| 7,351,632 B2 | * | 4/2008 | Visokay | H01L 21/823842 257/E21.637 |
| 7,387,927 B2 | * | 6/2008 | Turkot, Jr | H01L 21/28079 257/E21.202 |
| 7,410,874 B2 | * | 8/2008 | Verma | H01L 21/823462 257/E21.598 |
| 7,432,567 B2 | * | 10/2008 | Doris | H01L 21/823857 257/369 |
| 7,479,683 B2 | * | 1/2009 | Bojarczuk, Jr | H01L 21/28079 257/368 |
| 7,557,005 B2 | * | 7/2009 | Ishii | H01L 27/105 257/E21.179 |
| 7,611,942 B2 | * | 11/2009 | Minami | H01L 27/0629 257/E21.008 |
| 7,691,663 B2 | * | 4/2010 | Lee | H01L 27/14689 438/275 |
| 7,759,744 B2 | * | 7/2010 | Kimizuka | H01L 21/823857 257/204 |
| 7,763,510 B1 | * | 7/2010 | Zhang | H01L 21/823807 257/274 |
| 7,790,541 B2 | * | 9/2010 | Doris | H01L 21/823878 438/199 |
| 7,807,990 B2 | * | 10/2010 | Koyama | H01L 27/092 257/24 |
| 7,888,196 B2 | * | 2/2011 | Sridhar | H01L 21/76229 257/288 |
| 7,892,960 B2 | * | 2/2011 | Park | H01L 21/823462 257/E21.179 |
| 7,927,950 B2 | * | 4/2011 | Choi | H01L 21/823462 257/E21.683 |
| 7,944,004 B2 | * | 5/2011 | Takayanagi | H01L 21/28185 257/406 |
| 8,003,454 B2 | * | 8/2011 | Zhang | H01L 21/823807 438/197 |
| 8,022,460 B2 | * | 9/2011 | Yamazaki | H01L 27/105 257/314 |
| 8,076,734 B2 | * | 12/2011 | Zhu | H01L 21/3141 257/401 |

(56) References Cited

U.S. PATENT DOCUMENTS

| | | | | |
|---|---|---|---|---|
| 8,124,512 | B2 * | 2/2012 | Won | H01L 21/82345 438/157 |
| 3,138,049 | A1 | 3/2012 | You | |
| 8,129,287 | B2 * | 3/2012 | Suzuki | H01L 21/28194 438/745 |
| 8,169,017 | B2 * | 5/2012 | Ema | H01L 27/11526 257/315 |
| 8,222,111 | B1 * | 7/2012 | Hwang | H01L 29/792 257/E21.423 |
| 8,269,281 | B2 * | 9/2012 | Park | H01L 21/823462 257/365 |
| 8,274,115 | B2 * | 9/2012 | Teo | H01L 21/823807 257/347 |
| 8,283,223 | B2 * | 10/2012 | Iwamoto | H01L 21/823857 438/199 |
| 8,319,285 | B2 * | 11/2012 | Tilke | H01L 21/76251 257/255 |
| 8,421,144 | B2 * | 4/2013 | Kang | H01L 27/11521 257/317 |
| 8,518,775 | B2 * | 8/2013 | Liu | H01L 21/823878 438/258 |
| 8,536,660 | B2 * | 9/2013 | Hsu | H01L 21/823857 257/410 |
| 8,580,627 | B2 | 11/2013 | Peng et al. | |
| 8,592,922 | B2 * | 11/2013 | Hooker | H01L 21/28185 257/407 |
| 8,629,025 | B2 * | 1/2014 | Chen | H01L 29/792 438/287 |
| 8,633,079 | B2 * | 1/2014 | Shih | H01L 29/40117 438/287 |
| 8,633,537 | B2 * | 1/2014 | Polishchuk | H01L 29/4234 257/324 |
| 8,685,813 | B2 * | 4/2014 | Ramkumar | H01L 29/40117 438/211 |
| 8,685,820 | B2 * | 4/2014 | Tseng | H01L 27/14689 438/261 |
| 8,871,595 | B2 * | 10/2014 | Ramkumar | H01L 21/823412 438/287 |
| 8,916,432 | B1 * | 12/2014 | Ramkumar | H01L 27/11563 438/216 |
| 9,048,335 | B2 * | 6/2015 | Chen | H01L 21/823462 |
| 9,111,865 | B2 * | 8/2015 | Shroff | H01L 21/28273 |
| 9,142,566 | B2 * | 9/2015 | Hong | H01L 27/1203 |
| 9,171,915 | B1 * | 10/2015 | Chen | H01L 29/401 |
| 9,218,978 | B1 * | 12/2015 | Ramkumar | H01L 29/40117 |
| 9,236,313 | B2 * | 1/2016 | Na | H01L 21/324 |
| 9,331,081 | B2 * | 5/2016 | Lin | H01L 27/0928 |
| 9,530,783 | B2 * | 12/2016 | Lin | H01L 27/11563 |
| 9,679,817 | B2 * | 6/2017 | Chuang | H01L 21/82385 |
| 9,865,463 | B2 * | 1/2018 | Sakurai | H01L 21/32139 |
| 9,953,876 | B1 * | 4/2018 | Smith | H01L 21/823462 |
| 2002/0197800 | A1 * | 12/2002 | Hashimoto | H01L 21/823462 438/266 |
| 2004/0124477 | A1 * | 7/2004 | Minami | H01L 27/0629 257/379 |
| 2004/0185624 | A1 * | 9/2004 | Tamura | H01L 21/823462 438/275 |
| 2005/0118764 | A1 * | 6/2005 | Chou | H01L 21/823462 438/275 |
| 2006/0084249 | A1 * | 4/2006 | Yamada | H01L 21/76243 438/526 |
| 2006/0246651 | A1 * | 11/2006 | Chambers | H01L 21/823857 438/216 |
| 2007/0048920 | A1 * | 3/2007 | Song | H01L 21/823842 438/199 |
| 2010/0109044 | A1 * | 5/2010 | Tekleab | H01L 21/823807 257/190 |
| 2015/0325441 | A1 | 11/2015 | Tai et al. | |

* cited by examiner

SEMICONDUCTOR STRUCTURE AND MANUFACTURE METHOD THEREOF

RELATED APPLICATIONS

This application claims the benefit of Chinese Patent Application No. 201510420281.0, filed on Jul. 16, 2015, which is incorporated herein by reference in its entirety.

FIELD OF THE INVENTION

The present invention generally relates to the field of semiconductor devices and manufacturing methods, and more particularly to semiconductor structures and associated manufacturing methods.

BACKGROUND

The development of semiconductor technology allows for improvements in integration density and functionality of integrated dice. Semiconductor devices of different structures and electrical characteristics can be integrated into one integrated die or integrated circuit. For example, two different types (e.g., N-type and P-type) of metal oxide semiconductor effect transistors (MOSFET) can be formed on a common semiconductor substrate for CMOS devices. CMOS devices are widely employed in devices today, such as in logic circuits with low power consumption. Also, control dice of power converters can be formed by CMOS processes, resulting in relatively low power losses, higher integration, and faster speeds.

DETAILED DESCRIPTION

Figure 1A:
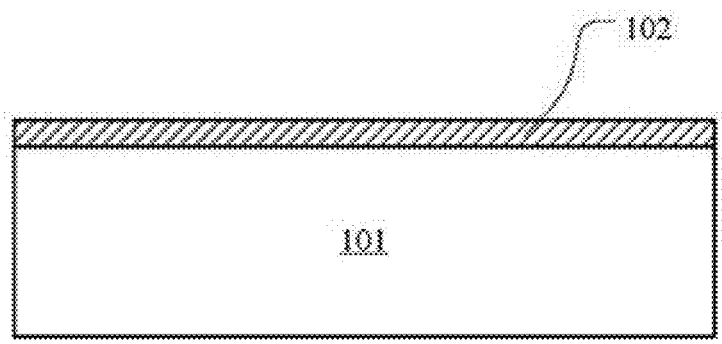
FIGS. 1A-1H are cross-sectional diagrams of a first example method of making a semiconductor structure that includes gate oxides of different thicknesses, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Only one type of transistor gate structure may be included in integrated die due to limitations of typical semiconductor processes. The gate structure can be a polysilicon gate, or composite gate formed by silicide layer and polysilicon. For example, a polysilicon gate with less thickness may be formed by processes less than 0.25 um, and a composite gate with greater thicknesses can be formed by processes larger than 0.35 um. A polysilicon gate may have a reduced line width, and a composite gate can have lower connection resistance. An integrated die including both polysilicon and composite gates may thus realize both advantages. However, it is difficult for processes to form the two different gates in one integrated die. Because the thickness of a polysilicon gate is generally lower, the dopant may penetrate the hard mask when implanting ion if the polysilicon gate is configured as the hard mask. Therefore, the hard mask may not restrict the scope of the doped region, which can induce semiconductor device failure.

In one embodiment, a method of making a semiconductor structure can include: (i) forming a plurality of oxide layers on a semiconductor substrate; (ii) forming a plurality of conductor layers on the plurality of oxide layers; (iii) forming plurality of thickening layers on the plurality of conductor layers; (iv) patterning the plurality of conductor layers and the plurality of thickening layers to form a hard mask; and (v) implanting ion using the hard mask to form a plurality of doped regions.

Referring now to FIGS. 1A-1H, shown are cross-sectional diagrams of a first example method of making a semiconductor structure that includes gate oxides of different thicknesses, in accordance with embodiments of the present invention. In this particular example, only the steps to form the stacked gate structure of a semiconductor structure are described, while the steps to form other parts of the semiconductor structure are understood. Initially, semiconductor substrate 101 can be formed of any suitable type(s) of semiconductor materials (e.g., silicon, germanium, SiGe, SOI, SiC, GaAs, any compound semiconductors of III/V groups, etc.).

Oxide layer 102 can be formed on semiconductor substrate 101 by an oxidation process (e.g., chemical oxidation, thermal oxidation, or the combination of both), as shown in FIG. 1A. For example, the thickness of oxide layer 102 can be from about 20 Å to about 100 Å, such as about 55 Å. In one example, thermal oxidation can be executed for a time interval from about 20s to about 120s at a temperature between about 600° C. and about 900° C. to form oxide layer 102. In another example, chemical oxidation can be executed in a water solution including O3 to form oxide layer 102. A photoresist layer can be formed on a surface of oxide layer 102. The photoresist layer can then be etched by a lithography process to form mask layer PR1 to cover a "first" region of semiconductor substrate 101, and to expose a "second" region of semiconductor substrate 101.

Figure 1B:
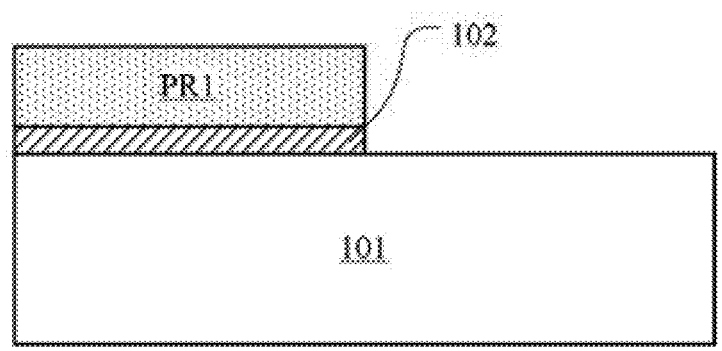
Figure 1C:
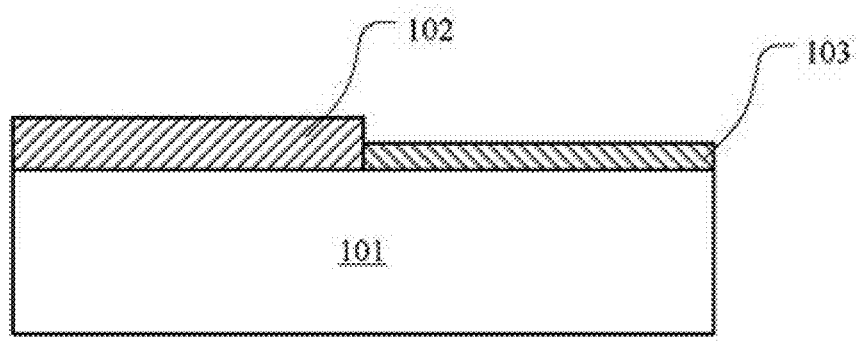

Through the opening of mask layer PR1, the exposed portion of oxide layer 102 on semiconductor substrate 101 can be etched by a wet etching process using an etchant. Due to the selectivity of the etchant, the etching process may be completed when the surface of semiconductor substrate 101 is exposed. As such, oxide layer 102 on the first region of semiconductor substrate 101 may remain as shown in FIG. 1B. After the etching process, mask layer PR1 can be removed by dissolving in solvent or an ashing process. Oxide layer 103 can be formed on the second region of semiconductor substrate 101, such as by the above oxidation processes, and as shown in FIG. 1C. The thickness of oxide layer 103 can be less than that of oxide layer 102. For example, the thickness of oxide layer 103 can be between about 10 Å and about 50 Å, such as about 30 Å.

For example, thermal oxidation process can be utilized in this step. The first region of semiconductor substrate 101 can be covered by oxide layer 102. When oxide layer 103 is growing by a thermal oxidation process, oxygen atoms can reach the surface of semiconductor substrate 101, penetrating oxide layer 102 to oxidize the surface of semiconductor substrate 101 underneath oxide layer 102. Therefore, oxide layer 102 may again grow in order to increase its thickness. As the thickness of the oxide layer increases, the growth speed is reduced, so the growth speed of oxide layer 102 is less than that of oxide layer 103.

Figure 1D:
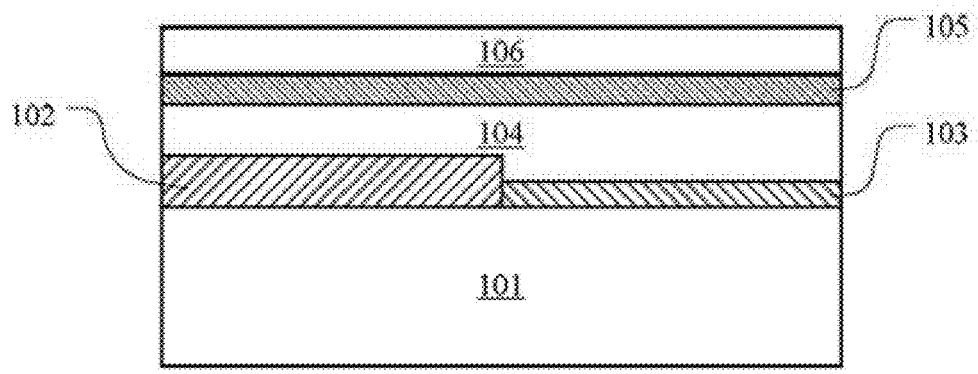

In one example, when the thickness of oxide layer 102 is about 55 Å and the thickness of oxide layer 103 is about 30 Å, due to the additional growth of oxide layer 102, the thickness of oxide layer 102 may increase to about 70 Å from about 55 Å. As shown in FIG. 1D, polysilicon layer 104 can be formed on oxide layers 102 and 103 by a deposition process (e.g., EBM, CVD, ALD, sputtering process, etc.). The thickness of polysilicon layer 104 can be between about 1000 Å and about 3000 Å, such as about 2000 Å.

A metal layer may be formed on polysilicon layer 104, such as by above deposition processes, which may then be siliconized in order to generate metal silicide layer 105. For example, metal silicide layer 105 can be formed by Wsix, the thickness of which can be between about 1000 Å and about 3000 Å, such as about 1500 Å. In one example, a tungsten (W) metal layer with a thickness between about 5 nm and about 12 nm can be deposited, and then the W metal layer may be heat treated for a time interval between about 1s and about 10s at temperature of between about 300° C. and about 500° C. Therefore, a chemical reaction may be carried out between the surface of polysilicon layer 104 and the W metal, in order to generate Wsix. The remaining W metal that has not been chemically reacted may be removed by a wet etching process.

Antireflection layer 106 can be formed on metal silicide layer 105, such as by the above deposition processes, as shown in FIG. 1D. In one example, antireflection layer 106 can be made by an oxide (e.g., silicon oxide) with a thickness of about 1000 Å. In other examples, antireflection layer 106 may be excluded. In some cases, the relatively strong light reflectivity of metal silicide layer 105 may adversely affect the alignment in the photolithography process. However, the reflection from metal silicide layer 105 may be decreased when the surface of metal silicide layer 105 is covered by antireflection layer 106.

Figure 1E:
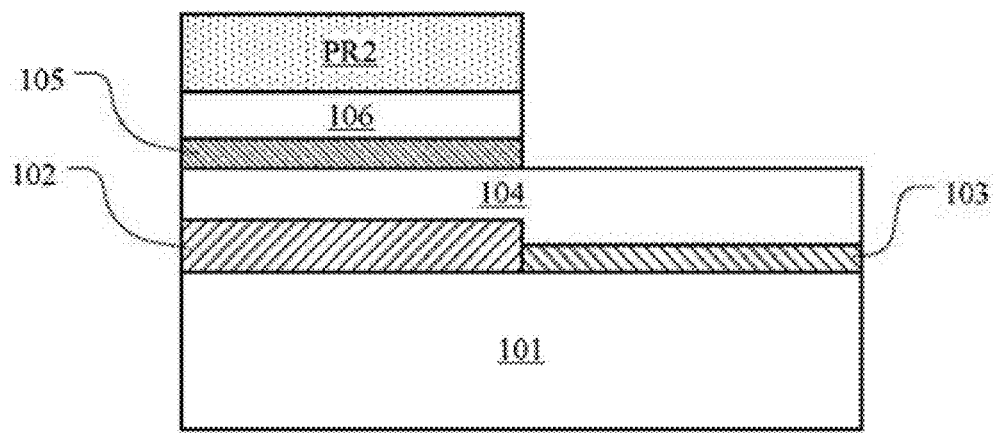

As shown in FIG. 1E, a photoresist layer can be formed on the surface of antireflection layer 106. Mask layer PR2 can be formed by etching the photoresist layer by a lithography process. The first region of semiconductor substrate 101 can be covered by mask layer PR2, and the second region of semiconductor substrate may be exposed. In one example, mask layer PR2 may be aligned with mask layer PR1. Therefore, both of mask layers PR1 and PR2 can be formed by a same mold. In another example, mask layer PR2 may be formed using a different mold than that of mask layer PR1. Mask layer PR2 can cover a portion of the first region, and may expose a portion of the second region. For example, a compound gate may be formed in the first region, and a polysilicon gate can be formed in the second region.

Through the opening of mask layer PR2, by a wet etching process using an etchant, the exposed portion of antireflection layer 106 and the exposed portion of metal silicide layer 105 from top to bottom can be etched until the surface of polysilicon layer 104 is exposed due to the selectivity of the etchant. As shown in FIG. 1E, the portion of antireflection layer 106 and metal silicide layer 105 on the first region of semiconductor substrate 101 can remain. Mask layer PR2 can be removed by dissolving in solvent or ashing process.

Figure 1F:
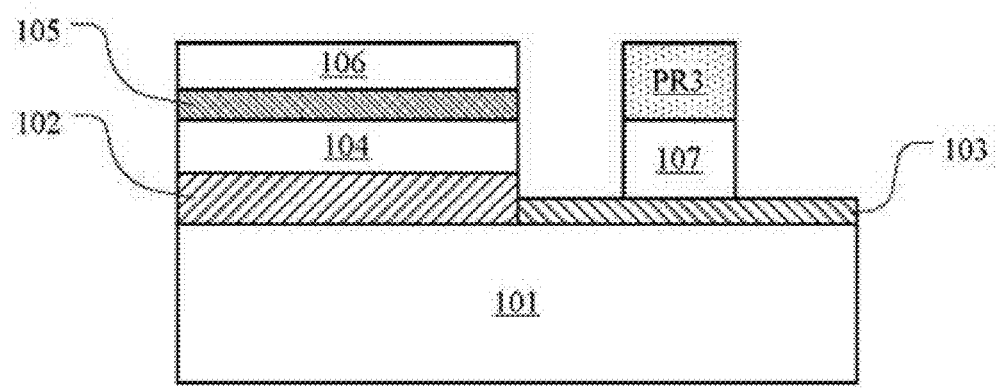

A photoresist layer may be formed on the surface of the semiconductor structure of FIG. 1E. As shown in FIG. 1F, mask layer PR3 can be formed by etching the photoresist layer by a lithography process. Only one portion of the second region of semiconductor substrate 101 can be covered by mask layer PR3, and the remaining portion of the second region of semiconductor substrate 101 can be exposed through the openings of mask layer PR3.

Through the openings of mask layer PR3, a wet etching process using an etchant may be employed. On the first region of semiconductor substrate 101, antireflection layer 106 can be configured as a hard mask. The exposed portion of polysilicon layer 104 can be etched selectively until the surface of oxide layer 103 is exposed due to the selectivity of the etchant. The remaining portion of polysilicon layer 104 on the second region of semiconductor substrate 101 may form gate conductor 107, as shown in FIG. 1F. After the etching process, mask layer PR3 can be removed by dissolving in solvent or ashing process.

Figure 1G:
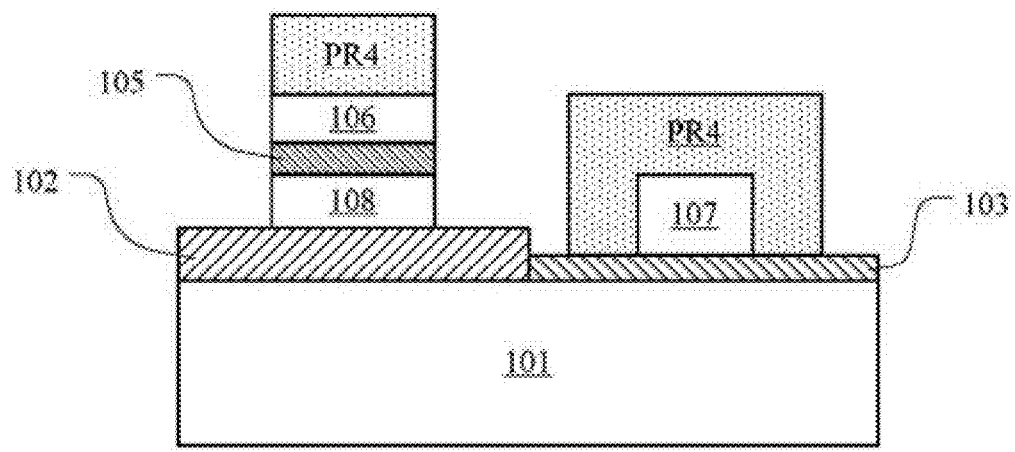

A photoresist layer can be formed on the top surface of the semiconductor structure as shown in FIG. 1F. In FIG. 1G, mask layer PR4 may be formed by etching the photoresist layer to cover a portion of the second region of semiconductor substrate 101 and gate conductor 107 on the second region. The remaining portions of the first and second regions of semiconductor substrate 101 may be exposed through the openings of mask layer PR4. Through the openings of mask layer PR4, a wet etching process can occur using an etchant.

From top to bottom, the exposed portion of antireflection layer 106, portion of metal silicide layer 105, and portion of polysilicon layer 104 can be etched until the surface of oxide layers 102 and 103 are exposed due to the selectivity of the etchant. The remaining portion of polysilicon layer 104 on the first region of semiconductor substrate 101 can be configured as gate conductor 108, as shown in FIG. 1G. Due to the protection of mask layer PR4, gate conductor 107 on the second region may remain during selective removal of polysilicon layer 104 on the first region. After the etching process, mask layer PR4 can be removed, such as by dissolving in solvent or ashing process.

Figure 1H:
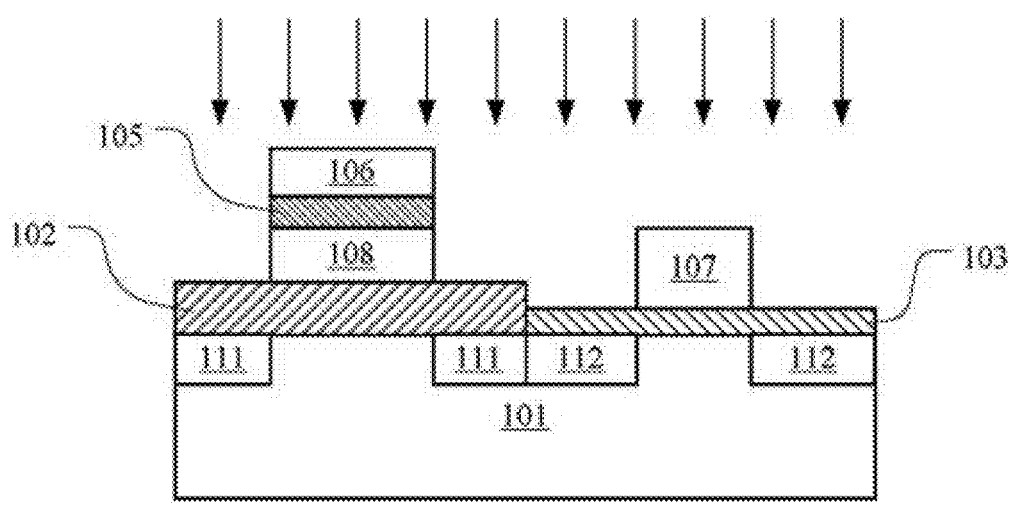

As shown in FIG. 1H, by a regular ion implanting process, doped regions may be formed in semiconductor substrate 101 to be configured as body 111 of semiconductor device, and body 112 of semiconductor device 112. On the first region of semiconductor substrate 101, antireflection layer 106 together with metal silicide layer 105 can be configured as a thickening layer. Both the thickening layer and gate conductor 108 can be configured as a hard mask layer. On the second region of semiconductor substrate 101, gate conductor 107 can be configured as a hard mask. In some cases, prior to the ion implanting process, a photoresist mask formed by etching a photoresist layer can be configured as an additional mask, in order to limit the scope of the doped region together with the hard mask. The doped regions may be aligned with the hard mask. Therefore, even though the thickness of gate conductor 108 is smaller than the thickness of gate conductor 107, the thickening layer on gate conductor 108 can be configured as a shield together with the conductor layer.

N-type dopants (e.g., P, As, etc.) can be implanted to form N-type semiconductor layers or regions, and P-type dopants (e.g., B, etc.) can be implanted to form P-type semiconductor layers or regions. By controlling the ion implantation parameters, such as implantation energy and dosage, targeted depth and doping concentrations can be achieved. After the formation of body regions 111 and 112, source and drain regions may be respectively formed in body regions 111 and 112. When forming source and drain regions, ions can be implanted given that the above hard mask and additional etchant resist are configured as a mask to form self-aligned doped regions.

In cases when body regions are not utilized, the source and drain regions of the semiconductor device can be directly formed in the step as shown in FIG. 1H. Therefore, the doped regions formed by employing the hard masks can be body regions and/or source and drain regions. Because the doped depth of body regions is greater than that of source and drain regions, the ion implantation energy for body regions may be larger, and dopants can penetrate the oxide layer more easily. Thus, during the process of ion implantation, the above hard mask provide an improved shield. In addition, an insulating interlayer, through-hole conductor penetrating the insulating interlayer, and connection structure connecting to the through-hole conductor, may also be included to form the full structure of the semiconductor device.

In accordance with the example above, oxide layer 102 can be on the semiconductor substrate. The portion of the oxide layer 102 on the first region of semiconductor substrate may remain, and the portion of oxide layer 102 on the second region of semiconductor substrate can be removed by etching mask PR1. Then, oxide layer 103 with a different thickness may be formed on the second region of the semiconductor substrate. Gate oxides with different thicknesses on the first and second regions of the semiconductor substrate may thus be formed by one mask (e.g., PR1) in order to decrease the number of masks and associated cost of the semiconductor device.

In one example, oxide layer 103 can be by thermal growth process, where oxide layer 102 grows again towards the bottom to increase its thickness. Due to characteristics of the thermal growth process, this increased thickness of oxide layer 102 is greater than that of oxide layer 103. Therefore, a gate oxide with a greater thickness can be achieved on the first region of the semiconductor substrate, and a gate oxide with a lesser thickness is achieved on the second region of the semiconductor substrate.

In one example, the antireflection layer can be configured as an additional hard mask in the gate conductor patterning step to decrease the amount of masks and alignment accuracy requirement of the photolithography. A compound gate conductor that includes a polysilicon layer and metal silicide can be formed in the first region of the semiconductor structure, and a single layer gate conductor that includes a polysilicon layer can be formed in the second region of the semiconductor structure. In other examples, the gate conductor in the first and second regions of the semiconductor structure can be same, such as where both are formed by a polysilicon layer.

In one example, both the antireflection layer and metal silicide layer can be configured as a thickening layer to from a hard mask together with the gate conductor in the step of forming doped regions in order to generate the body region regions of the semiconductor device. For those examples without the antireflection layer, the metal silicide layer as a thickening layer, together with the gate conductor, can be configured as the hard mask. In another alternative example, a nitride layer (e.g., SiNx) can be directly formed on the gate conductor, and may be configured as the thickening layer. In the step of forming the doped region, the nitride layer and gate conductor 108 can be configured as a hard mask. After forming the doped region, the thickening layer can be removed, or may remain as a portion of the semiconductor device.

In one embodiment, a semiconductor structure can include: (i) a semiconductor substrate; (ii) a plurality of oxide layers on the semiconductor substrate; (iii) a first semiconductor device in a first region of the semiconductor substrate, where the first semiconductor device comprises a first oxide layer and a first gate conductor on the first oxide layer, and where the first gate conductor comprises a conductor layer; and (iv) a second semiconductor device in a second region of the semiconductor substrate, where the second semiconductor device comprises a second oxide layer and a second gate conductor on the second oxide layer, and where the second gate conductor comprises a conductor layer and a silicide layer.

Figure 2:
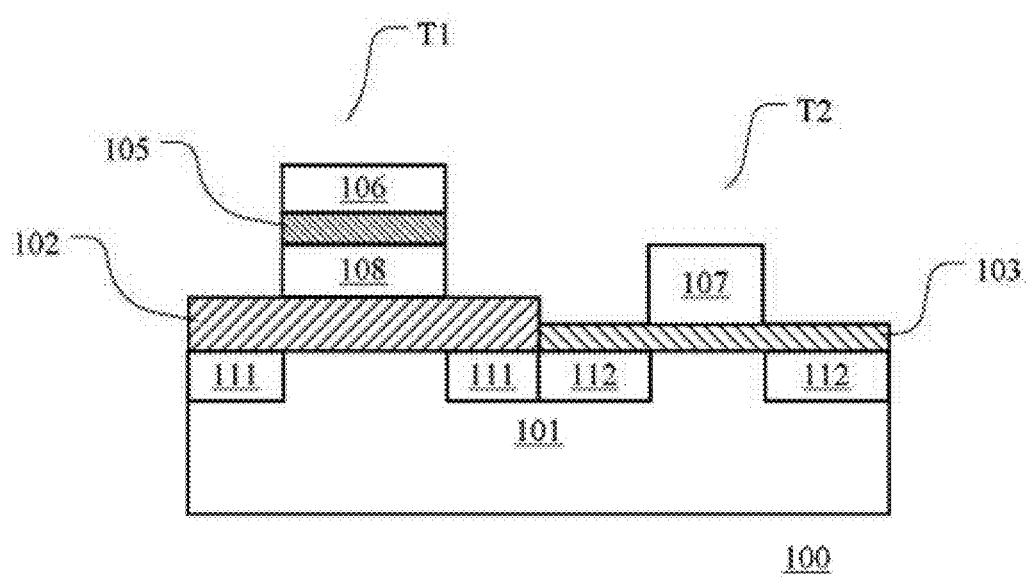
FIG. 2 is a cross-sectional diagram of an example semiconductor structure that includes gate oxides of different thicknesses, in accordance with embodiments of the present invention.

Referring now to FIG. 2, shown is a cross-sectional diagram of an example semiconductor structure that includes gate oxides of different thicknesses, in accordance with embodiments of the present invention. Semiconductor structure 100 can include semiconductor substrate 101, semiconductor device T1 in the first region of semiconductor substrate 101, and semiconductor device T2 in the second region of semiconductor substrate 101. Semiconductor device T1 can include oxide layer 102 in the first region of semiconductor substrate 101, polysilicon layer 108, metal silicide layer 105, and antireflection layer 106 stacked in sequence on oxide layer 102. Semiconductor device T2 can include oxide layer 103 in the second region of semiconductor substrate 101, and polysilicon layer 107 stacked on second oxide layer 103.

The thickness of oxide layer 102 may be greater than that of oxide layer 103. Also, the lateral boundaries of oxide layers 102 and 103 may be overlapped. As shown in FIG. 2, the top surface of oxide layer 102 can be higher than that of oxide layer 103, and the bottom surface of oxide layer 102 may not be lower than that of oxide layer 103. In this particular example, a compound gate conductor that includes a polysilicon layer and metal silicide may be formed in the first region of the semiconductor structure, and a single layer gate conductor that includes a polysilicon layer can be formed in the second region of the semiconductor structure. In other examples, the gate conductor in the first and second regions of the semiconductor structure can be same, such as whereby both are formed by a polysilicon layer.

The gate conductor can be formed including stacked layers, as described above. Also, those skilled in the art will recognize that before the formation of oxide layer 102, wells of different dopants can be formed in the semiconductor substrate. The semiconductor structure can also include an insulating interlayer, a through-hole conductor penetrating the insulating interlayer, and a connection structure connecting to the through-hole conductor to form the complete structure of semiconductor devices T1 and T2.

Figure 3A:
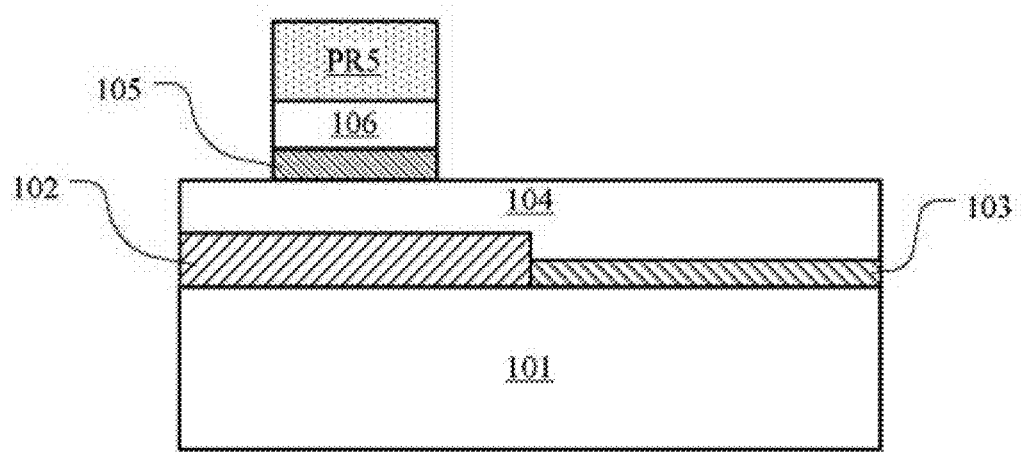
FIGS. 3A-3B are cross-sectional diagrams of a second example method of making a semiconductor structure that includes gate oxides of different thicknesses, in accordance with embodiments of the present invention.
Figure 3B:
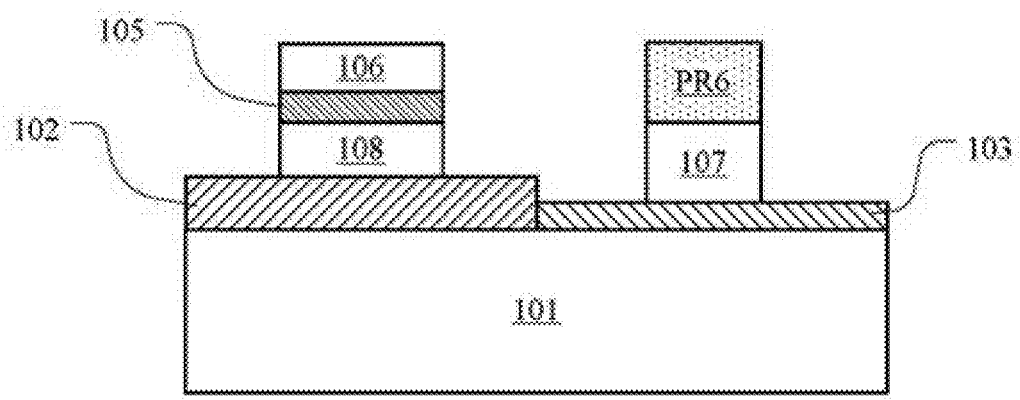

Referring now to FIGS. 3A-3B, shown are cross-sectional diagrams of a second example method of making a semiconductor structure that includes gate oxides of different thicknesses, in accordance with embodiments of the present invention. For clarity, only the steps of forming the gate conductor are described, and the formation steps of other parts of the semiconductor structure are omitted here. Thus, the steps of FIGS. 3A and 3B can occur after the steps of FIGS. 1A-1D. Photoresist may be grown on the surface of antireflection layer 106, and mask PR5 can be formed by etching the photoresist by a photolithography process. A portion of a first region of semiconductor substrate 101 may be covered by mask PR5, and the remaining portion of the first region and the entire second region can be exposed. In this example, mask PR5 may be different from mask PR1.

Exposed portions of antireflection layer 106 and metal silicide layer 105 may be etched from top to bottom though the opening of mask PR5 by a wet etching process using an etchant until the surface of polysilicon layer 104 is exposed due to the selectivity of the etchant. As shown in FIG. 3A, antireflection layer 106 and metal silicide layer 105 in the first region of semiconductor substrate 101 may remain. After etching, mask PR5 can be removed by dissolving in a solvent or by an ashing process. Then, photoresist can grow on the surface of the semiconductor structure of FIG. 3A, which can be etched by photolithographic to form mask PR6, as shown in FIG. 3B. A portion of the second region of semiconductor substrate 101 may be covered by mask PR6, and the remaining portion of the second region can be exposed through the opening of mask PR6.

Antireflection layer 106 can be configured as additional hard mask. The exposed portion of polysilicon layer 104 may be removed by a wet etching process using an etchant through the opening of mask PR6 until the surface of oxide layers 102 and 103 is exposed due to the selectivity of etchant. The remaining portion of polysilicon layer 104 in the first region of semiconductor substrate 101 can be configured as gate conductor 107, as shown in FIG. 3B. After etching, mask PR6 may be removed, such as by dissolving in a solvent, or by an ashing process.

The mask formed by the photoresist and antireflection layer may be configured as a hard mask, and the polysilicon layer can be patterned to form gate conductors 107 and 108. As compared with the above examples, the number of masks can be decreased, and the masks need not be aligned accurately, in order to decrease the manufacture cost and to improve the reliability and yield rate.

Figure 4A:
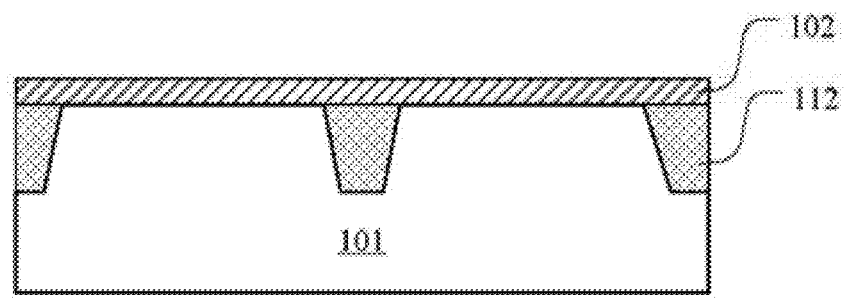
FIGS. 4A-4C are cross-sectional diagrams of a third example method of making a semiconductor structure including gate oxide of different thicknesses, in accordance with embodiments of the present invention.
Figure 4B:
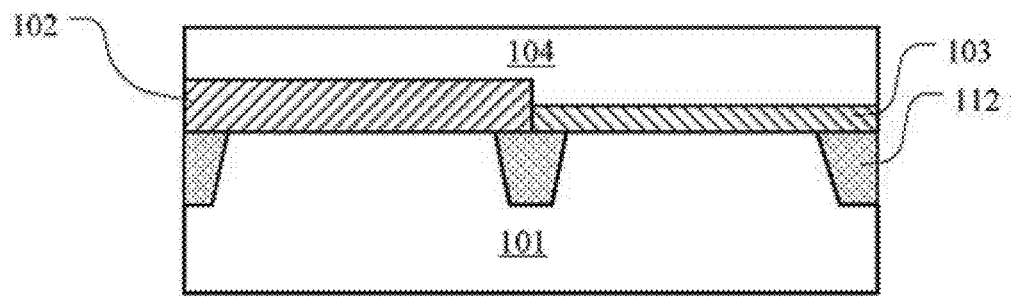
Figure 4C:
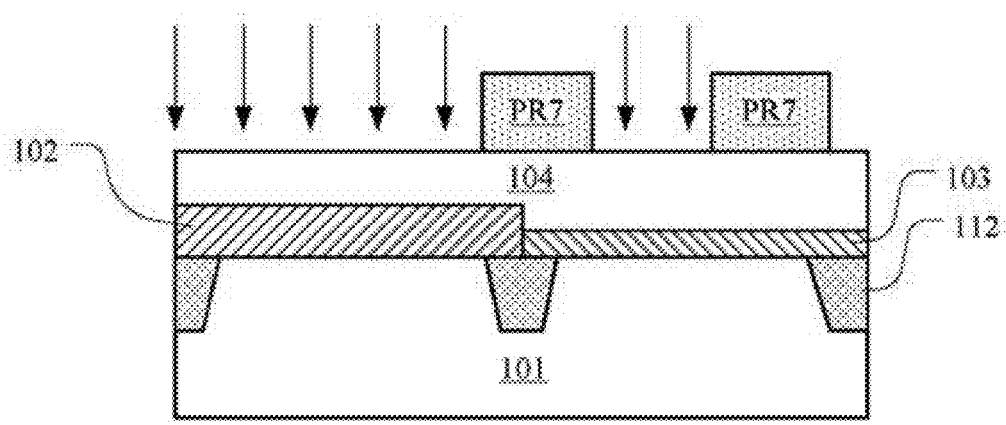

Referring now to FIGS. 4A-4C, shown are cross-sectional diagrams of another example method of making a semiconductor structure including gate oxide of different thicknesses, in accordance with embodiments of the present invention. For clarity, only the steps of forming gate conductor may be described here, and the formation steps of other portions of the semiconductor structure are omitted.

Different from the step of FIG. 1A, prior to the formation of oxide layer 102, shallow trench isolation (STI) 112 may be formed in semiconductor substrate 101, in order to restrict the active regions of semiconductor devices T1 and T2. For example, semiconductor substrate 101 may be etched to form trenches. Then, insulation material can be filled in the trenches by a deposition process. Insulation material outside of the trenches can be removed, such as by a chemical mechanical planarization (CMP) process, to form STI 112. As shown in FIG. 4A, oxide layer 102 can be formed on semiconductor substrate 101 by an oxidation process (e.g., chemical oxidation, thermal oxidation, or a combination of both).

Polysilicon layer 104 may be formed on oxide layers 102 and 103, such as by a deposition process, as shown in FIG. 4B. Photoresist can be formed on the surface of the semiconductor structure. Mask PR7 can be formed by etching the photoresist by a photolithography process. The exposed portion of polysilicon layer 104 through the opening of mask PR7 can be configured to form gate conductors of NMOS devices in the first and second regions.

As shown in FIG. 4C, an ion implantation process can occur. Dopants may enter polysilicon layer 104 through the openings of mask PR7. After the ion implantation process, mask PR7 can be removed, such as by dissolving in a solvent or by an ashing process. The threshold voltage of the MOSFET can mainly be determined by the difference of work functions between the gate conductor and channel material. For an N-type MOSFET, the work function can be changed by doping polysilicon layer 104 in order to regulate the threshold voltage. Because the active regions of the semiconductor devices T1 and T2 are restricted by STI 112, the reliability of the semiconductor devices may be improved. In addition, multiple types of semiconductor devices can be integrated into a single semiconductor die because the threshold voltage can be regulated by doping the polysilicon layer.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of making a semiconductor structure, the method comprising:
   a) forming a first oxide layer of a first thickness on a semiconductor substrate;
   b) forming a first region mask to cover a first region of the semiconductor substrate, and to expose a second region of the semiconductor substrate;
   c) etching the first oxide layer on the second region of the semiconductor substrate;
   d) removing the first region mask;
   e) employing an oxidation process to grow a second oxide layer of a second thickness on the second region, whereby the oxidation process simultaneously results in the first oxide layer not changing its composition while being increased to a third thickness, wherein the second thickness is less than the first thickness;
   f) forming a first gate structure on the first region of the semiconductor substrate, and forming a second gate structure on the second region of the semiconductor substrate, wherein the forming the first and second gate structures comprises forming a polysilicon layer on the first and second oxide layers, forming a thickening layer on the polysilicon layer, and patterning the thickening layer to form a patterned thickening layer located only in the first region, and to expose the polysilicon layer in the second region using a mask layer; and
   g) forming a plurality of doped regions by implanting ions into the semiconductor substrate using the first gate structure as a first hard mask on the first region and the second gate structure as a second hard mask on the second region.

2. The method of claim 1, further comprising:
   a) etching the patterned thickening layer in the first region and patterning the polysilicon layer remaining in the first region to respectively form an etched thickening layer and a first conductor layer, wherein the first hard mask comprises the first conductor layer; and
   b) patterning the polysilicon layer in the second region to form a second conductor layer, wherein the second hard mask comprises the second conductor layer.

3. The method of claim 2, wherein the first conductor layer is configured as a first gate conductor, and wherein the second conductor layer is configured as a second gate conductor.

4. The method of claim 2, wherein the etched thickening layer comprises a metal silicide layer.

5. The method of claim 2, wherein the first conductor layer and the etched thickening layer form a composite gate conductor.

6. The method of claim 4, wherein the thickening layer further comprises an antireflection layer on the metal silicide layer.

7. The method of claim 3, wherein forming the first and second gate conductors comprises:
   a) etching the thickening layer in the second region to expose the polysilicon layer in the second region;
   b) etching the polysilicon layer in the second region on a predetermined portion of the second oxide layer to form the second gate conductor; and
   c) etching the thickening layer and the polysilicon layer in the first region on a predetermined portion of the first oxide layer to form the first gate conductor.

8. The method of claim 1, further comprising doping a portion of the polysilicon layer to regulate a work function.

9. The method of claim 2, wherein the second conductor layer and the second oxide layer combined is thinner than the thickening layer, the first conductor layer, and the first oxide layer combined.

* * * * *